United States Patent [19]
Fossum et al.

[11] Patent Number: 6,107,618
[45] Date of Patent: Aug. 22, 2000

[54] INTEGRATED INFRARED AND VISIBLE IMAGE SENSORS

[75] Inventors: Eric R. Fossum, La Crescenta; Bedabrata Pain, Los Angeles, both of Calif.

[73] Assignee: California Institute of Technology, Pasadena, Calif.

[21] Appl. No.: 09/114,338

[22] Filed: Jul. 13, 1998

Related U.S. Application Data

[60] Provisional application No. 60/055,698, Jul. 14, 1997.

[51] Int. Cl.$^7$ ...................................................... H01L 27/00
[52] U.S. Cl. .................................... 250/208.1; 250/214.1; 250/370.08; 257/291
[58] Field of Search ............................. 250/208.1, 214.1, 250/226, 214 LS, 214 LA, 370.09, 370.08, 330; 257/440, 431, 291, 80–84

[56] References Cited

U.S. PATENT DOCUMENTS

| | | | |
|---|---|---|---|
| 5,149,956 | 9/1992 | Norton | 250/226 |
| 5,567,975 | 10/1996 | Walsh et al. | 257/440 |
| 5,811,815 | 9/1998 | Marshall et al. | 250/338.4 |

*Primary Examiner*—Que T. Le
*Attorney, Agent, or Firm*—Fish & Richardson P.C.

[57] ABSTRACT

Semiconductor imaging devices integrating an array of visible detectors and another array of infrared detectors into a single module to simultaneously detect both the visible and infrared radiation of an input image. The visible detectors and the infrared detectors may be formed either on two separate substrates or on the same substrate by interleaving visible and infrared detectors.

19 Claims, 1 Drawing Sheet

INTEGRATED INFRARED AND VISIBLE IMAGE SENSORS

This application claims the benefit of the U.S. Provisional Application No. 60/055,698, filed on Jul. 14, 1997, which is incorporated herein by reference.

ORIGIN OF THE INVENTION

The invention described herein was made in the performance of work under a NASA contract, and is subject to the provisions of Public Law 96-517 (35 U.S.C. 202) in which the Contractor has elected to retain title.

FIELD OF THE INVENTION

The present invention relates to radiation sensing devices, and more particularly to semiconductor imaging devices.

BACKGROUND

Semiconductor materials have been widely used to construct detector arrays for detecting radiation energy in imaging applications. One common implementation of a semiconductor detector array is a monolithic configuration in which both the radiation-sensitive material and signal-transmitting paths are formed on the same layer. Monolithic arrays are easy to manufacture and relatively inexpensive. However, the areas taken by the signal-transmitting paths do not directly sense radiation. This can reduce the image resolution and detection sensitivity.

A semiconductor detector array can also be formed in a hybrid configuration having a first radiation-sensitive layer and a separate second layer for signal transmission and processing. The two layers are often bonded together by bump bonds so that electrical signals can be transferred from the radiation-sensitive layer to the second layer. Since almost all area on the radiation-sensitive layer is used for sensing an input image, a higher fill factor can be achieved to improve the detection sensitivity and image resolution.

Two commonly used spectral ranges for many imaging applications are the infrared wavelengths and visible wavelengths. Different semiconductor materials are usually used in these two different spectral ranges since different energy band structures are needed to interact with the radiation.

Many conventional imaging systems or cameras are designed with semiconductor sensors to detect radiation in only one of these two common spectral ranges. Two different conventional imaging devices or cameras are often needed in order to detect images in both visible and infrared wavelengths.

In particular, certain applications require capturing images in both visible and infrared spectral ranges. For example, an object under measurement may produce both visible and infrared rays at the same time and both types of rays are needed to obtain useful information. However, using two different imaging devices for respectively detecting infrared and visible signals can be problematic in situations where space and weight for imaging equipment are limited. In addition, using two separate imaging devices is often more expensive than using a single imaging device.

It may be possible to perform imaging detection in both infrared range and visible range by using two separate detector arrays. The optical path in such systems can be split into an infrared path for the infrared detector array and a visible path for the visible detector array.

SUMMARY

The present disclosure provides integrated semiconductor sensors that are capable of detecting both infrared and visible images. A common optical path can be used for both infrared and visible signals.

One embodiment of the present invention includes a semiconductor substrate having a first portion formed with a monolithic visible detector array and a second portion configured to have an electronic processing circuit and an infrared detector array mounted to the second portion of the substrate by bump bonds. The electrical signals generated by the infrared detector array are transmitted to the processing circuit through the bump bonds.

Another embodiment includes a base substrate having a first portion and a second portion, a visible detector array mounted to the first portion of the base substrate, and an infrared detector array mount the second portion of the base substrate. The first and second portions of the base substrate have first and second readout multiplexers that are respectively connected to the visible detector array and the infrared detector array.

Yet another embodiment includes a monolithic visible detector array that detects visible radiation and transmits infrared radiation, and a monolithic infrared detector array that is attached to one side of the visible detector array to receive infrared radiation transmitted through the visible detector array. Alternatively, the monolithic infrared detector may be replaced by a hybrid infrared detector array.

Still another embodiment of the invention is a monolithic detector array having interleaved visible and infrared detector pixels formed on a substrate. Both the visible and infrared detector pixels use CMOS readout circuits.

These and other aspects and advantages of the present invention will become more apparent in light of the following detailed description, the accompanying drawings, and the claims.

DETAILED DESCRIPTION OF THE PREFERRED EMBODIMENTS

An integrated infrared and visible imager can be formed in two different configurations. In a first configuration, a visible detector array and a separate infrared detector array are integrated together on a connected substrate. Alternatively, a monolithic detector array can have visible detector sensors and infrared detector sensors that are interleaved relative to one another.

Figure 1:
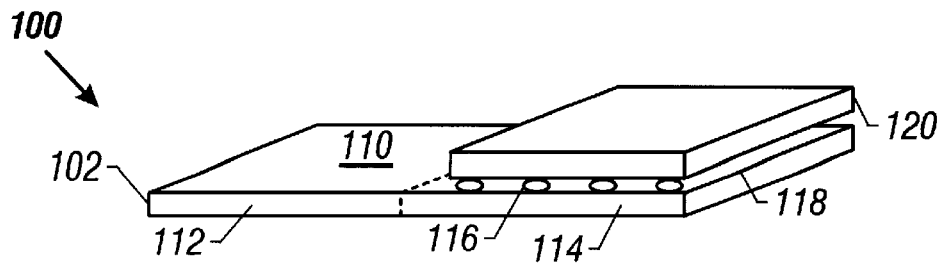
FIG. 1 is a diagram illustrating one embodiment of an integrated infrared and visible imager based a monolithic visible detector array and a hybrid infrared detector array.

FIGS. 1–4 show exemplary implementations of the first configuration. FIG. 1 illustrates an integrated infrared and visible imager 100 that is formed by a monolithic visible detector array 110 and a hybrid infrared detector array 120. The visible detector array 110 is displaced relative to the infrared detector array 120. A semiconductor substrate 102 (i.e., formed of silicon) is partitioned into a first portion 112 and a second portion 114. The monolithic visible array 110 is formed in the first portion 112 and each visible detector may be an active pixel sensor. Active pixel sensors are disclosed in U.S. Pat. No. 5,471,515 to Fossum et al. and U.S. Pat. No. 5,576,763 to Ackland et al., which are incorporated herein by reference. The second portion 114 has infrared readout circuitry 118 (e.g., an infrared readout multiplexer) for the infrared array 120.

The infrared array 120 is formed of a semiconductor material that responds to infrared radiation in a selected wavelength or spectral range. This material is usually different from the semiconductor used in the visible array 110 for responding to radiation in a selected visible spectral range. The infrared array 120 is connected to the infrared circuitry 118 on the substrate 102 by bump bonds 116 (e.g., indium bumps) to transfer electrical signals generated by the infrared array 120 to the infrared circuitry 118. The dimension and number of the indium bumps 116 effectively define the sensing pixels and therefore resolution of the images produced by the infrared detector array 120.

The integrated imager 100 can simultaneously sense both visible and infrared images. A signal processor may be connected to the infrared readout circuitry 118 and the monolithic visible array 110 to receive and process image signals.

Figure 2:
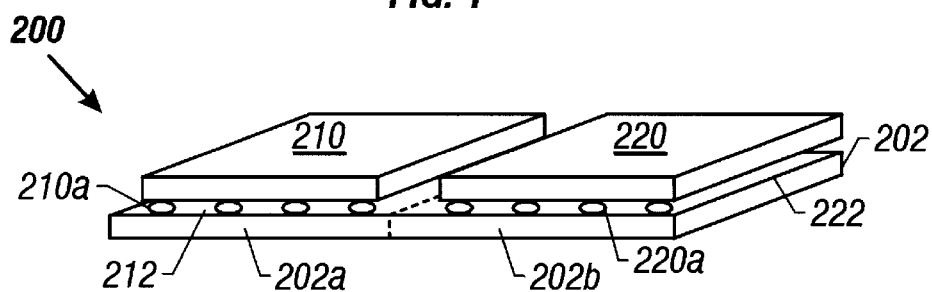
FIG. 2 is a diagram illustrating another embodiment of an integrated infrared and visible image sensor based on a hybrid visible detector array and a hybrid infrared detector array.

FIG. 2 shows a second integrated infrared and visible imager 200 of the first configuration. A hybrid visible detector array 210 (e.g., a PIN fully depleted detector) and a hybrid infrared detector array 220 are displaced with each other and are integrated onto a common semiconductor substrate 202 (e.g., silicon). The substrate 202 includes a first portion 202a formed with visible readout circuitry 212 for the visible array 210 and a second portion 202b formed with infrared readout circuitry 214 for the infrared array 220, respectively. Two sets of bump bonds, 210a and 220a, are formed to respectively bond the arrays 210 and 220 to the first and second portions 202a and 202b of the substrate 202.

Figure 3:
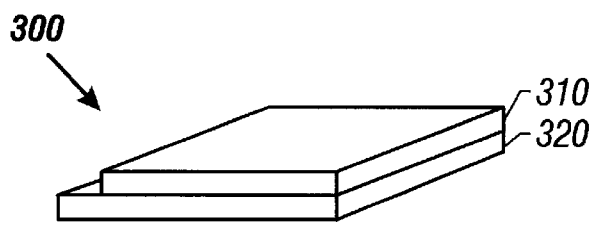
FIG. 3 is a diagram illustrating yet another embodiment of an integrated infrared and visible image sensor formed by a monolithic visible detector array stacked on a monolithic infrared detector array.

Another implementation of an integrated imager in the first configuration stacks a visible detector array over an infrared detector array. FIG. 3 illustrates such an imager 300 having a monolithic visible array 310 and a monolithic infrared array 320. The visible array 310 may be formed of silicon so that infrared radiation can transmit therethrough to reach the infrared array 320. The back side of the visible array 310 may be polished to reduce image distortion in transmitted infrared images. The pixel pitch of the arrays 310 and 320 may be independently configured to meet requirements of a specific application and are not necessarily matched. Wire bonds can be made between infrared and visible readout circuits to share signals or to permit sensor fusion data processing on one or both detector arrays 310 and 320. Since the visible and infrared arrays are stacked one over the other, the optical path for the two sensing arrays are the same. This makes it easier to correlate the image portions with each other. Therefore, each pixel of the infrared array can be interpolated with a corresponding pixel of the visible array.

Figure 4:
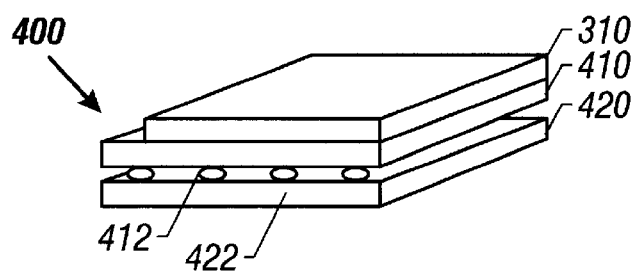
FIG. 4 is a diagram illustrating a modified integrated infrared and visible image sensor based on the device shown in FIG. 3.

FIG. 4 shows an alternative implementation of the integrated imager 300 in FIG. 3. A hybrid infrared detector having a sensing layer 410 and a readout layer 422 formed on a substrate 420 is used to replace the monolithic infrared detector array 320 of the detector shown in FIG. 3.

Figure 5:
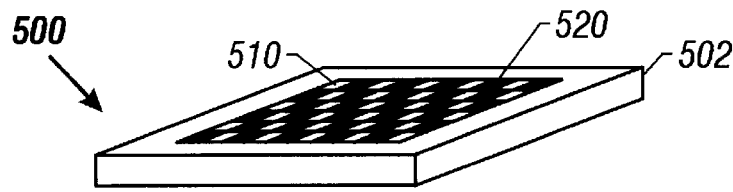
FIG. 5 is a diagram illustrating an embodiment of a monolithic integrated infrared and visible image sensor formed by interleaved visible detector pixels and infrared detector pixels.

FIG. 5 is a diagram of one embodiment of an integrated imager in the second configuration. A monolithic detector array 500 is formed by visible detector sensors 510 and infrared detector sensors 520 on a semiconductor substrate 502. The visible sensors 510 and infrared sensors 520 are interleaved relative to one another in a common layer into a checkboard pattern. Similar to the embodiments shown in FIGS. 3 and 4, the optical path for the two sensing arrays are the same and it is relative easy to correlate the image portions with each other. Therefore, each pixel of the infrared array can be interpolated with a corresponding pixel of the visible array. The number of visible sensors 510 are in general not necessarily the same as the number of infrared sensors 520 so that the resolution of visible images may be different from that of the infrared images. In addition, the spatial patterns formed by the visible sensors 510 and the infrared sensors 520 may also be different.

Preferably, both types of sensors are formed by a CMOS process. The visible sensors 510 may be active pixel sensors and the infrared sensors 520 may be thermopile sensors or bolometer sensors. The readout circuits for both types of sensors are also CMOS circuits.

Although the present invention has been described in detail with reference to the preferred embodiments, various modifications and enhancements may be made without departing from the spirit and scope of the invention as defined by the appended claims.

What is claimed is:

1. A radiation-sensing device, comprising:

first and second semiconductor substrates respectively formed of first and second semiconductor materials that are different from each other;

a first detector array formed of said first semiconductor material in said first semiconductor substrate and configured to have detectors to detect first radiation in a visible spectral range to produce first electrical signals indicating said first radiation;

a first readout circuit formed in said first semiconductor substrate relative to said first detector array and connected to receive said first electrical signals;

a second detector array formed of said second semiconductor material in said second semiconductor substrate and configured to have detectors to detect second radiation in an infrared spectral range to produce second electrical signals indicating said second radiation;

a second readout circuit coupled to said second detector array to receive said second electrical signals, wherein said first semiconductor substrate and said second semiconductor substrate are physically bonded together to form an integrated module.

2. The device as in claim 1, wherein said first detector array and said first readout circuit are formed in a common layer on said first semiconductor substrate.

3. The device as in claim 2, wherein said first substrate has a first portion configured to form said first detector array and said first readout circuit, and a second portion configured to form said second readout circuit, and said device further comprising a plurality of bump bonds bonding said first and second semiconductor substrates together to transfer said second electrical signals to said second readout circuit.

4. The device as in claim 2, further comprising:

a third semiconductor substrate configured to form said second readout circuit; and a plurality of bump bonds configured to bond said second substrate and said third substrate together to transfer said second electrical signals to said second readout circuit, wherein said first semiconductor substrate is stacked over said second semiconductor substrate on a side opposing said third semiconductor substrate to detect radiation in said visible spectral range and to transmit radiation in said infrared spectral range.

5. The device as in claim 2, wherein said second semiconductor substrate stacks with said first semiconductor substrate in such a way that said second detector array receives infrared radiation that transmits through said first detector array.

6. The device as in claim 2, wherein said first detector array and said first readout circuit form an active pixel detector array.

7. A radiation-sensing device, comprising
first and second semiconductor substrates respectively formed of first and second semiconductor materials that are different from each other;
a first detector array formed of said first semiconductor material in said first semiconductor substrate and configured to have detectors to detect first radiation in a visible spectral range to produce first electrical signals indicating said first radiation;
a first readout circuit coupled to said first detector array to receive said first electrical signals;
a second detector array formed of said second semiconductor material in said second semiconductor substrate and configured to have detectors to detect second radiation in an infrared spectral range to produce second electrical signals indicating said second radiation;
a second readout circuit coupled to said second detector array to receive said second electrical signals,
wherein said first semiconductor substrate and said second semiconductor substrate are physically bonded together to form an integrated modules;
a third semiconductor substrate to have a first region configured to form said first readout circuit and a second region formed on a common surface as said first region and configured to form said second readout circuit;
a first set of bump bonds bonding said first semiconductor substrate to said third semiconductor substrate and to transfer said first electrical signals to said first readout circuit; and
a second set of bump bonds bonding said second semiconductor substrate to said third semiconductor substrate and to transfer said second electrical signals to said second readout circuit.

8. A radiation-sensing device, comprising:
a substrate formed of a semiconductor material;
a plurality of first sensing pixels on a surface of said substrate formed of a first semiconductor material that responds to radiation in a visible spectral range of an input image to produce first electrical signals indicative of visible radiation in said input image; and
a plurality of second sensing pixels formed on said surface of said substrate and interleaved with said first sensing pixels in the same layer or said substrate such that one of said second sensing pixels is located between two of said first sensing pixels, each second sensing pixel formed of a second semiconductor material that is different from said first semiconductor material to respond to radiation in an infrared spectral range of said input image to produce second electrical signals indicative of infrared radiation in said input image.

9. The device as in claim 8, wherein said first detector array is an active pixel detector array.

10. The device as in claim 8, wherein each sensing pixel in said second detector array is a thermopile detector or a bolometer detector.

11. The device as in claim 1, wherein said first semiconductor material includes silicon.

12. The device as in claim 3, wherein said first semiconductor material includes silicon.

13. The device as in claim 4, wherein said first semiconductor material includes silicon.

14. The device as in claim 5, wherein said first semiconductor material includes silicon.

15. The device as in claim 7, wherein said first semiconductor material includes silicon, and said third semiconductor substrate includes silicon.

16. The device as in claim 8 wherein said first semiconductor material includes silicon, and wherein said first and second sensing pixels are active pixel sensors.

17. The device as in claim 8, wherein a number of said first sensing pixels is different from a number of said second sensing pixels.

18. A radiation-sensing device, comprising:
a silicon substrate to receive an input image;
a first detector array of sensing pixels formed in said silicon substrate and configured to absorb visible radiation in said input image to produce first electrical signals indicating absorbed visible radiation;
a first readout multiplexer formed in said silicon substrate and coupled to said first detector array to output said first electrical signals;
another substrate formed of a semiconductor material that is different from silicon, coupled to said silicon substrate and positioned in an optical path of said input image to receive infrared radiation in said input image that transmits through said silicon substrate; and
a second detector array of sensing pixels formed in said another substrate and configured to detect said infrared radiation to produce second electrical signals.

19. The device as in claim 18, further comprising a second readout multiplexer coupled to said second detector array to output said second electrical signals.

* * * * *